United States Patent
Minifie et al.

(10) Patent No.: US 12,112,828 B2
(45) Date of Patent: Oct. 8, 2024

(54) MODIFICATION OF A COMMAND TIMING PATTERN

(71) Applicant: Micron Technology, Inc., Boise, ID (US)

(72) Inventors: Carl L. Minifie, Boise, ID (US); Phong T. Nguyen, Boise, ID (US); Alexander A. Tomaso, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 17/938,002

(22) Filed: Oct. 4, 2022

(65) Prior Publication Data

US 2023/0162767 A1 May 25, 2023

Related U.S. Application Data

(60) Provisional application No. 63/283,083, filed on Nov. 24, 2021.

(51) Int. Cl.
*G11C 7/10* (2006.01)
*G11C 11/4076* (2006.01)

(52) U.S. Cl.
CPC ............ *G11C 7/109* (2013.01); *G11C 7/1069* (2013.01); *G11C 7/1093* (2013.01); *G11C 11/4076* (2013.01)

(58) Field of Classification Search
CPC ..... G11C 7/109; G11C 7/1069; G11C 7/1093; G11C 11/4076
See application file for complete search history.

(56) References Cited

U.S. PATENT DOCUMENTS 6,438,062 B1 * 8/2002 Curtis ................. G11C 7/1018
365/230.01
6,948,046 B2 * 9/2005 Higuchi ............... G11C 7/1072
711/201

(Continued)

OTHER PUBLICATIONS

"International Search Report and Written Opinion of the International Searching Authority," issued in connection with Int'l Appl. No. PCT/US2022/079545, dated Mar. 9, 2023 (10 pages).

(Continued)

*Primary Examiner* — Son L Mai
(74) *Attorney, Agent, or Firm* — Holland & Hart LLP

(57) ABSTRACT

Methods, systems, and devices for modification of a command timing pattern are described. A host device may transmit (e.g., issue), to a memory device, a quantity of deselect commands between activation or data access commands to satisfy configured timing constraints. Each deselect command may indicate a polarity (e.g., a high voltage or a low voltage) for a command and address (CA) pin at the memory device. In some examples, the quantity of deselect commands may include one or more sequences of deselect commands (e.g., low-high-high-high). The host device may truncate a sequence of deselect commands, for example to satisfy timing constraints without transmitting additional unnecessary commands. By dynamically configuring the quantity of deselect commands, the host device may improve latency and overall efficiency of system operations without violating the configured timing constraints.

35 Claims, 8 Drawing Sheets

(56) References Cited

U.S. PATENT DOCUMENTS

| | | |
|---|---|---|
| 10,908,820 B2 * | 2/2021 | Malladi .............. G06F 15/7821 |
| 11,977,465 B2 * | 5/2024 | Li ......................... G06F 11/263 |
| 2011/0141795 A1 | 6/2011 | Matsuzaki et al. |
| 2011/0141836 A1 | 6/2011 | Luthra et al. |
| 2015/0309743 A1 | 10/2015 | Sohn et al. |
| 2017/0076778 A1 | 3/2017 | Mochida |
| 2021/0020213 A1 | 1/2021 | Mirichigni et al. |

OTHER PUBLICATIONS

JEDEC Solid State Technology Association, "DDR5 SDRAM," JEDEC, Oct. 2021, 490 pages, JESD79-5A.

* cited by examiner

MODIFICATION OF A COMMAND TIMING PATTERN

CROSS REFERENCE

The present Application for Patent claims the benefit of U.S. Provisional Patent Application No. 63/283,083 by MINIFIE et al., entitled "MODIFICATION OF A COMMAND TIMING PATTERN," filed Nov. 24, 2021, assigned to the assignee hereof, and expressly incorporated by reference in its entirety herein.

FIELD OF TECHNOLOGY

The following relates generally to one or more systems for memory and more specifically to modification of a command timing pattern.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
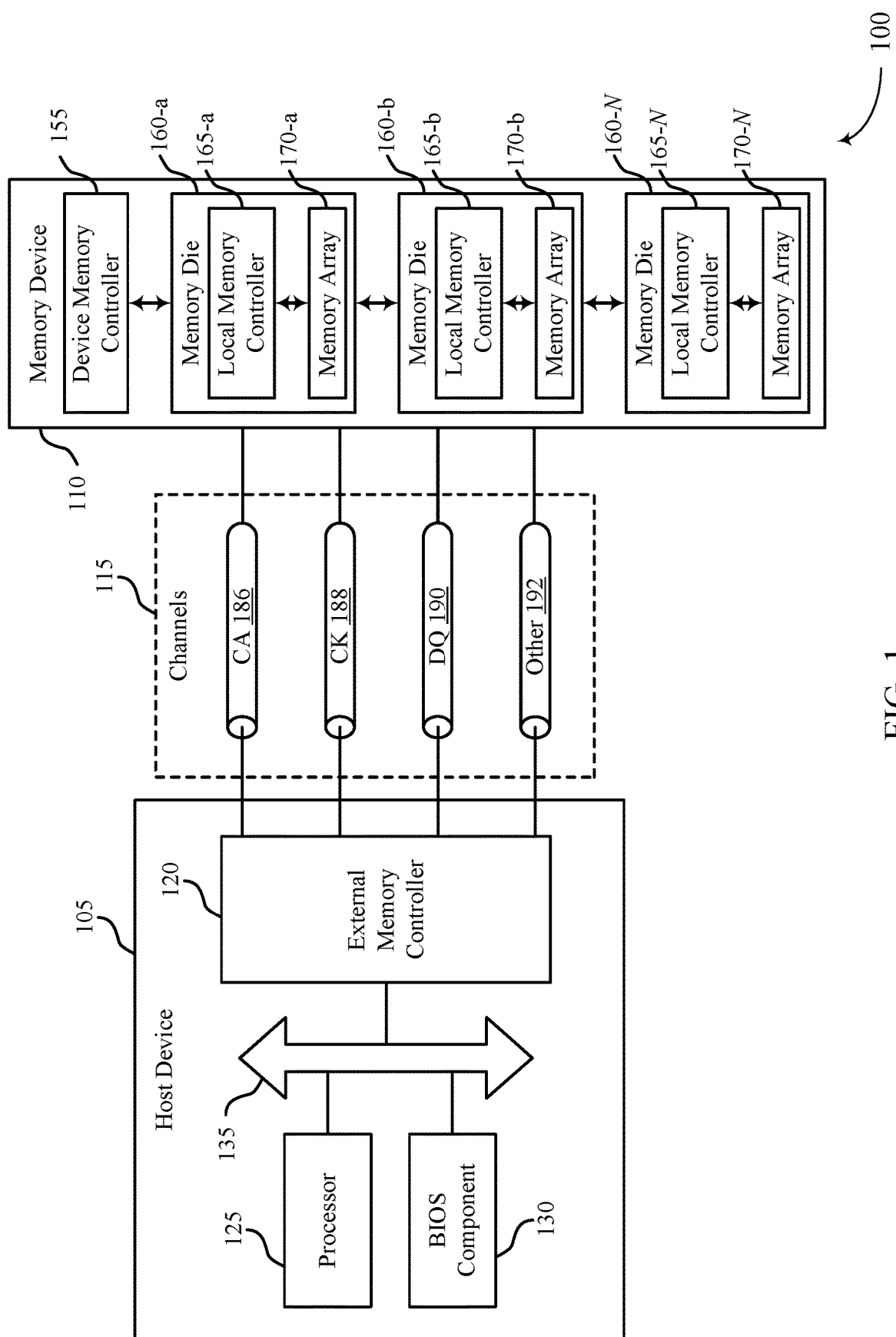
FIG. 1 illustrates an example of a system that supports modification of a command timing pattern in accordance with examples as disclosed herein.

To access a memory cell within a row of a subarray within a bank of a memory device (e.g., a random access memory (RAM) device), separate operations may be performed which may be triggered by separate, corresponding commands (e.g., sent by a host device or a controller such as a controller of the host device) to the memory device. For example, the memory device may receive an activation command for a set (e.g., a row) of memory cells, which may trigger an activation operation. The activation operation may activate (e.g., open) the set of memory cells within a given subarray of a given bank. After the activation command, the memory device may receive a data access command (e.g., a read, a write, a program, a rewrite) directed to the activated set of memory cells. Based on the data access command, the memory device may read data from or write data to one or more memory cells of the activated set.

Each of the steps of the memory access operations (e.g., activating, accessing) may have an associated latency. In some cases, the memory access operations may be subject to one or more configured memory timing constraints, for example according to an industry standard specification (e.g., a JEDEC DDR5 specification). A row access to column access delay (such as tRCD) may represent a minimum duration between an activation command and an associated data access command, which may be based on a capability of a memory device. An activation command window (e.g., a four activation window (such as tFAW)) may be a rolling duration in which a configured quantity of activation commands (e.g., four activation commands) may be received and processed at the memory device. An activation command delay, such as a row activation delay (e.g., a row-to-row activation delay (such as tRRD)) or a column activation delay (e.g., a column-to-column activation delay (such as tCCD)), may be a duration between consecutive activation commands. In some examples, such as when a host device transmits (e.g., issues) consecutive activation commands to banks of different bank groups of a memory array at the memory device, the row activation delay may be a shortened row activation delay (such as tRRD_S) or the column activation delay may be a shortened column activation delay (such as tCCD_S).

In accordance with examples as disclosed herein, a host device may transmit (e.g., issue), to a memory device, a quantity of deselect commands (which may be referred to as a DES command, a DSEL command, a device deselect command, or a command inhibit command) between activation or data access commands to satisfy configured timing constraints (e.g., tRCD, tFAW, tRRD_S, tCCD_S). Each deselect command may indicate, for example, a polarity (e.g., a high voltage or a low voltage) for a command and address (CA) pin at the memory device. In some examples, the quantity of deselect commands may include one or more sequences (e.g., groupings, sets) of deselect commands (e.g., low-high-high-high). The host device may truncate a sequence of deselect commands, for example to satisfy timing constraints without transmitting additional unnecessary commands. By dynamically configuring the quantity of deselect commands based on the truncating, the host device may improve latency and overall efficiency of system operations without violating the configured timing constraints.

Features of the disclosure are initially described in the context of systems and dies as described with reference to FIGS. 1 and 2. Features of the disclosure are described in the context of a memory system and a command timeline as described with reference to FIGS. 3 and 4. These and other features of the disclosure are further illustrated by and described with reference to an apparatus diagram and flowcharts that relate to modification of a command timing pattern as described with reference to FIGS. 5-8.

FIG. 1 illustrates an example of a system 100 that supports modification of a command timing pattern in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

In some examples, a memory array 170 may include multiple memory banks, and each memory bank may include multiple subarrays. In some cases, each subarray may include multiple rows of memory cells, which may be accessible by an external device (e.g., a host device 105, an external memory controller 120). A given subarray may include or utilize a corresponding latching circuit, which may allow the memory device 110 to maintain phases (e.g., timing signals associated with a row access operation) for a row of memory cells of the given subarray independent of phases for rows of memory cells in other subarrays, for example, independent of phases for rows of memory cells for other subarrays in the same bank.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more CA channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

The external memory controller 120 may be part of or associated with a host device 105 and may send one or more commands to the memory device 110 via the CA channels 186. Each of the commands may have an associated latency. In accordance with examples as disclosed herein, the external memory controller 120 (or the host device 105) may transmit (e.g., issue), via the CA channels 186, a quantity of deselect commands between activation or data access commands to satisfy configured timing constraints (e.g., tRCD, tFAW, tRRD_S, tCCD_S). Each deselect command may indicate a polarity (e.g., a high voltage or a low voltage) for a CA pin at the memory device 110. In some examples, the quantity of deselect commands may include one or more sequences of deselect commands. The host device 105 may truncate a sequence of deselect commands, for example to satisfy timing constraints without transmitting additional unnecessary commands. By dynamically configuring the quantity of deselect commands, the host device 105 may improve latency and overall efficiency of system operations without violating the configured timing constraints.

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
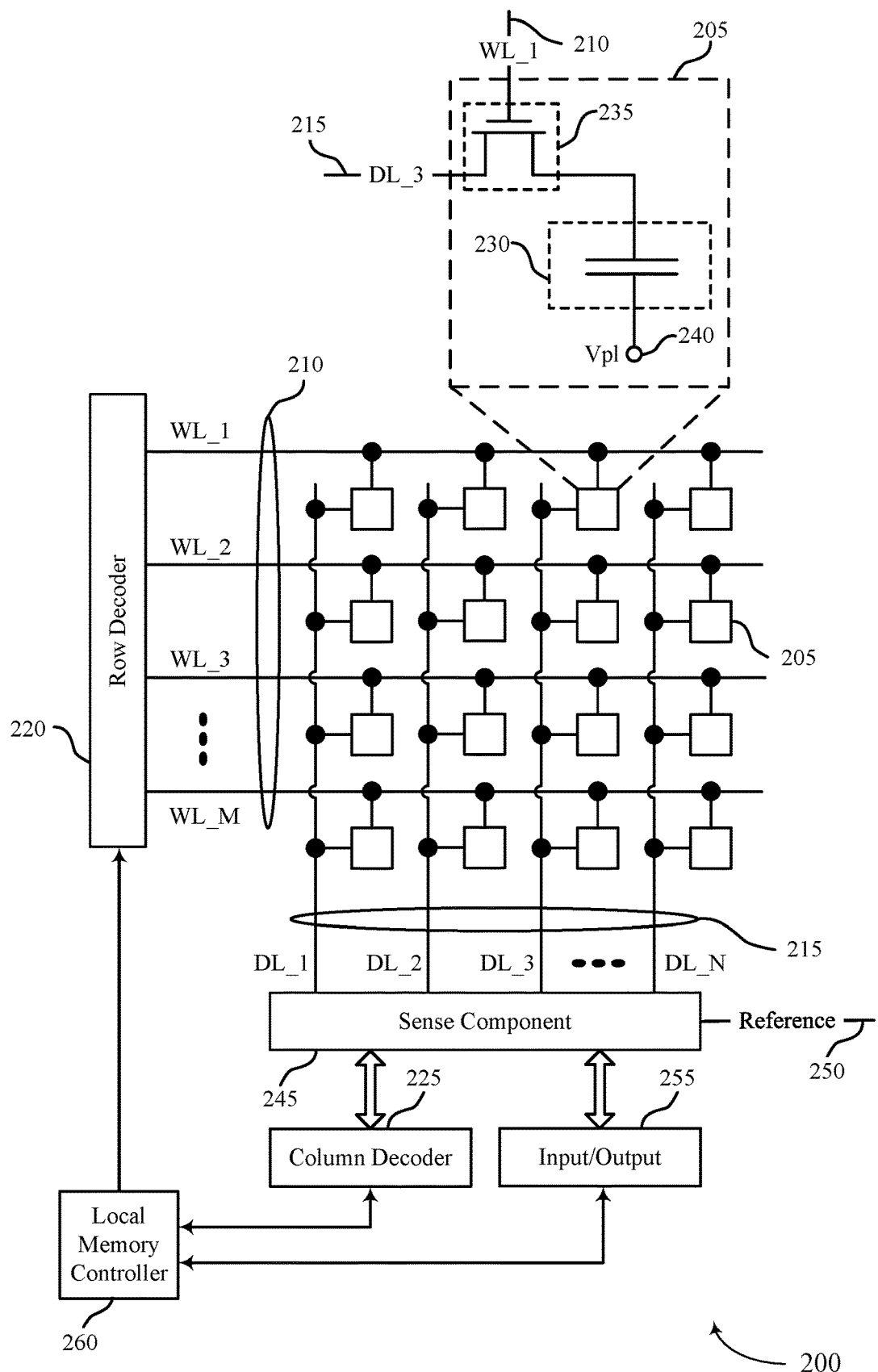
FIG. 2 illustrates an example of a memory die that supports modification of a command timing pattern in accordance with examples as disclosed herein.

FIG. 2 illustrates an example of a memory die 200 that supports modification of a command timing pattern in accordance with examples as disclosed herein The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vp1, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

In some examples, a portion of memory cells 205 may be part of a row of memory cells 205 of a subarray of a memory bank. The row of memory cells 205 may be accessed (e.g., by a host device) through one or more commands. For example, the row of memory cells 205 may be opened based on an activation command. An access command (e.g., a read command or a write command) may access data stored on or write data to the row of memory cells 205, and the row of memory cells 205 may be closed based on a precharge command. In some examples, an indication of a location of a second activation command may be included in another command, such as a previous command (e.g., a first activation command or a precharge command). Access to a second row of memory cells 205 may be initiated at an earlier time (e.g., before the second activation command is received) based on the indication.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be operable to couple and/or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may transmit commands to the sense component 245 or the row decoder 220 to initiate a row access operation (e.g., by initiating a first activation operation to open a row). In some cases, the local memory controller 260 may transmit the commands based on an indication, such as a command, from the host device 105 as described with reference to FIG. 1. In accordance with examples as disclosed herein, the host device may transmit (e.g., issue), to the local memory controller, a quantity of deselect commands between activation or data access commands to satisfy configured timing constraints (e.g., tRCD, tFAW, tRRD_S, tCCD_S). In some examples, the quantity of deselect commands may include one or more sequences of deselect commands. The host device may truncate a sequence of deselect commands, for example to satisfy timing constraints without transmitting additional unnecessary commands. By dynamically configuring the quantity of deselect commands, the host device may improve latency and overall efficiency of system operations without violating the configured timing constraints.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

Figure 3:
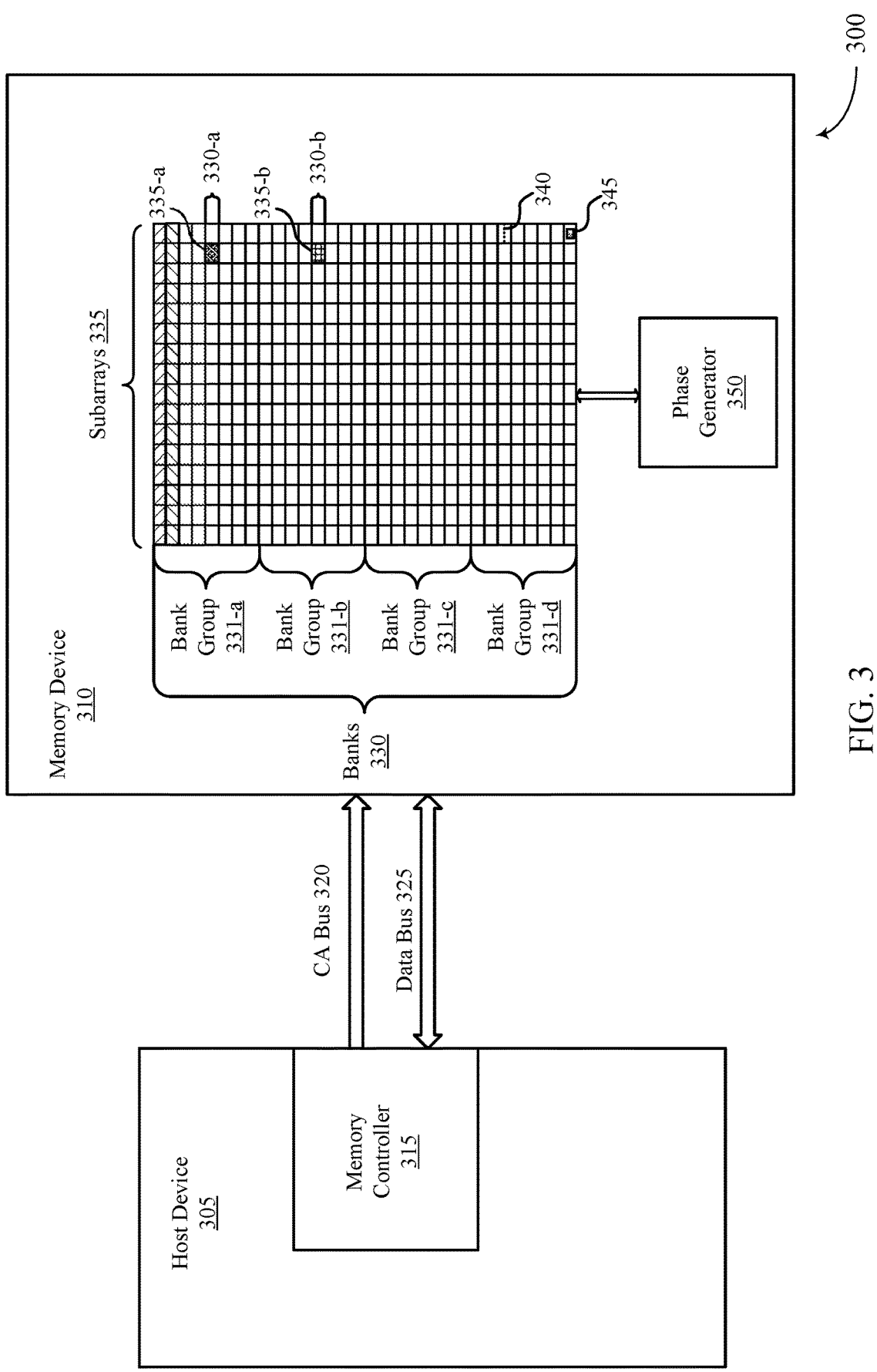
FIG. 3 illustrates an example of a memory system that supports modification of a command timing pattern in accordance with examples as disclosed herein.

FIG. 3 illustrates an example of a memory system 300 that supports modification of a command timing pattern in accordance with examples as disclosed herein. Memory system 300 may include host device 305 and memory device 310. Host device 305 may include memory controller 315 (which may be an example of an external memory controller as described with reference to FIG. 1), which may communicate with memory device 310 (which may be an example of a memory device 110 as described with reference to FIG. 1) through CA bus 320 or data bus 325. Memory device 310 may utilize DRAM, FeRAM, or other types of memory to store data at the memory device 310. The data stored in memory device 310 may be accessible by memory controller 315 and the process of accessing data stored at memory device 310 by memory controller 315 may be referred to as an access operation or a data access operation.

An access operation, such as a read or write operation, may be communicated (e.g., sent by the host device 305) to memory device 310 as a series of commands (e.g., as a command sequence). The commands may be communicated to memory device 310 by memory controller 315, for example, over CA bus 320 (which may be an example of a CA channel 186). The commands may be received by memory device 310, and may trigger corresponding operations at a memory device 310 to read, write, or otherwise access data stored by the memory device 310 (e.g., at one or more memory cells of the memory device 310). The data stored at or written to the memory device 310 may be communicated between the host device 305 and the memory device 310 over data bus 325 (which may be an example of a DQ channel 190).

Memory device 310 may include multiple subarrays 335. The subarrays 335 may store data contained in memory device 310. Subarrays 335 may be grouped into banks 330, which may be grouped into bank groups 331. In some examples, memory device 310 may contain, in some examples, thirty-two banks 330 in four bank groups 331, each of which may contain one or more subarrays 335 of memory cells. For instance, one or more banks 330 may contain sixteen subarrays 335. First subarray 335-a and second subarray 335-b may be examples of subarrays 335 and, as shown in this example, are located in banks 330-a and 330-b, respectively, of memory device 310. The bank 330-a may be located in a bank group 331-a, and the bank 330-b may be located in a different bank group 331-b. The subarrays 335 may each contain individual rows of memory cells, such as row 340, that may store data associated with memory device 310 or may have data written thereto.

In some cases, a command received by the memory device 310 may cause the memory device 310 to generate one or more related phases (e.g., using phase generator 350). For example, for each activation or data access command received by the memory device 310, the phase generator 350 of the memory device 310 may generate a related set of phases. The related set of phases may refer to or may include timing signals that collectively trigger or otherwise control sequences of internal operations within a subarray 335.

Executing a commanded operation may include executing a collection of such internal operations (e.g., executing an activation operation at a subarray 335 may include executing a first collection of phase-controlled internal operations, executing an access operation such as a read or write operation at a subarray 335 may include executing a second collection of phase-controlled internal operations, and executing a precharge operation at a subarray 335 may include executing a third collection of phase-controlled internal operations). Thus, the phases may influence (e.g., determine) the internal timing of the access operations of a given row of a given subarray 335 to which the commands are directed. In some examples, the phases may be internal timing signals that trigger the electrical operations (e.g., the physical electrical operations) corresponding to the commanded operations on an individual row basis to access memory cells of a given row 340.

The memory device 310 may include any number of phase generators 350 (e.g., one per subarray 335, one per bank 330, one per memory die, or one per memory device 310). In some examples, subarray-level phases may enable parallel subarray operations. As one example, a phase generator 350 may be included in or include aspects of a device memory controller 155 or a local memory controller 165 included in the memory device 310. As another example, a phase generator 350 may include logic or other special-purpose circuitry, which may be included in, coupled with, or otherwise associated with the bank 330 targeted by the corresponding command (e.g., each bank 330 may include, be coupled with, or be otherwise associated with a respective phase generator 350)—that is, phases may be generated on a per-bank 330 basis. Phases and other signals generated within the memory device 310 but outside of a corresponding subarray 335 may include, be coupled with, or be otherwise associated with a respective phase generator 350, and phases may be generated locally for each subarray 335.

Global phases may be generated per bank 330. This may support different banks 330 being accessed concurrently (in parallel, with access to rows in different banks 330 at least partially overlapping in time). In some examples, an activation or precharge operation on a row 340 in a bank 330 may occur while an activation or precharge operation occurs on a row 340 in a different bank 330 in a memory device 310.

In some examples, each subarray 335 may include, use, or otherwise be associated with a corresponding (e.g., one corresponding) row buffer for accessing the data stored in the subarray 335. Additionally or alternatively, each subarray 335 within a bank 330 may include, use, or otherwise be associated with a corresponding latching circuit 345, which may duplicate phases associated with the subarray 335 and maintain (e.g., preserve, store) the phases independent of phases associated with the remaining subarrays 335 in the bank 330 or the memory device 310. For example, a latching circuit 345 may store duplicate versions (e.g., copies) of global phases or other signals associated with (e.g., for executing operations on) the corresponding subarray 335.

Accessing a row 340 may involve one or more operations, and each operation may contribute to the overall latency of accessing the row. Such operations may be based on (e.g., in response to) corresponding commands, which may be communicated by memory controller 315 to the memory device 310. The commands to access a row 340 within a subarray 335 in a bank 330 may include an activation command (e.g., corresponding to an activation operation), a data access command (e.g., corresponding to a read operation, a write operation, a program operation, a reset operation, a rewrite operation), and a precharge command (e.g., corresponding to an activation operation). The activation operation may open the row 340 of memory cells. The access operation may access the data contained in the opened (e.g., activated) row 340 (e.g., in the case of a read operation) or write data into the opened row 340 (e.g., in the case of a write operation). The precharge operation may close the opened row 340.

All three operations may be performed to access a row 340 of memory cells within a subarray 335 in a bank 330 of memory device 310. In some examples, the activation operation may be performed before an access operation to open the row 340. Additionally, the precharge operation may be performed to close the activated row 340. In some cases, a precharge operation may be performed before a subsequent access operation of a row 340 in the same bank 330. The corresponding commands may be communicated from memory controller 315 to memory device 310 as a series of commands (e.g., as a command sequence). The commands may include an activation command, a data access command, and a precharge command, and may be received in the order the corresponding operations are performed.

In accordance with examples as disclosed herein, the host device 305 may transmit (e.g., issue), via the memory controller 315, a quantity of deselect commands to the memory device 310 between activation or data access commands to satisfy configured timing constraints (e.g., tRCD, tFAW, tRRD_S, tCCD_S). For example, the host device 305 may transmit a first activation command via the CA bus 320 to activate a row 340 of the subarray 335-a. After transmitting the first activation command, the host device 305 may transmit a quantity of deselect commands via the CA bus 320 to satisfy the configured timing constraints. The host device 305 may subsequently transmit a second activation command to activate a row 340 of the subarray 335-b. For example, where the subarray 335-a is in a different bank group 331 than the subarray 335-b, the quantity of deselect commands may be based on the shortened row activation delay or shortened column activation delay (e.g., tRRD_S or tCCD_S). Additionally or alternatively, the quantity of deselect commands may be based on tRCD or the activation command window. For example, the host device 305 may transmit the quantity of deselect commands to satisfy tRCD between the first activation command and a corresponding data access command (e.g., a read command). In some examples, the host device 305 may additionally transmit a third activation command and a fourth activation command, where the quantity of deselect commands may be based on the activation command window (e.g., tFAW) such that a fifth activation command is transmitted outside the activation command window.

In some examples, each deselect command may indicate a polarity (e.g., a high voltage or a low voltage) for, for example, a CA pin (e.g., a pin coupled with the CA bus 320) at the memory device 310. In some examples, the quantity of deselect commands may include one or more sequences of deselect commands. The host device 305 may truncate a sequence of deselect commands, for example to satisfy timing constraints without transmitting additional unnecessary commands. By dynamically configuring the quantity of deselect commands, the host device may improve latency and overall efficiency of system operations without violating the configured timing constraints.

Figure 4:
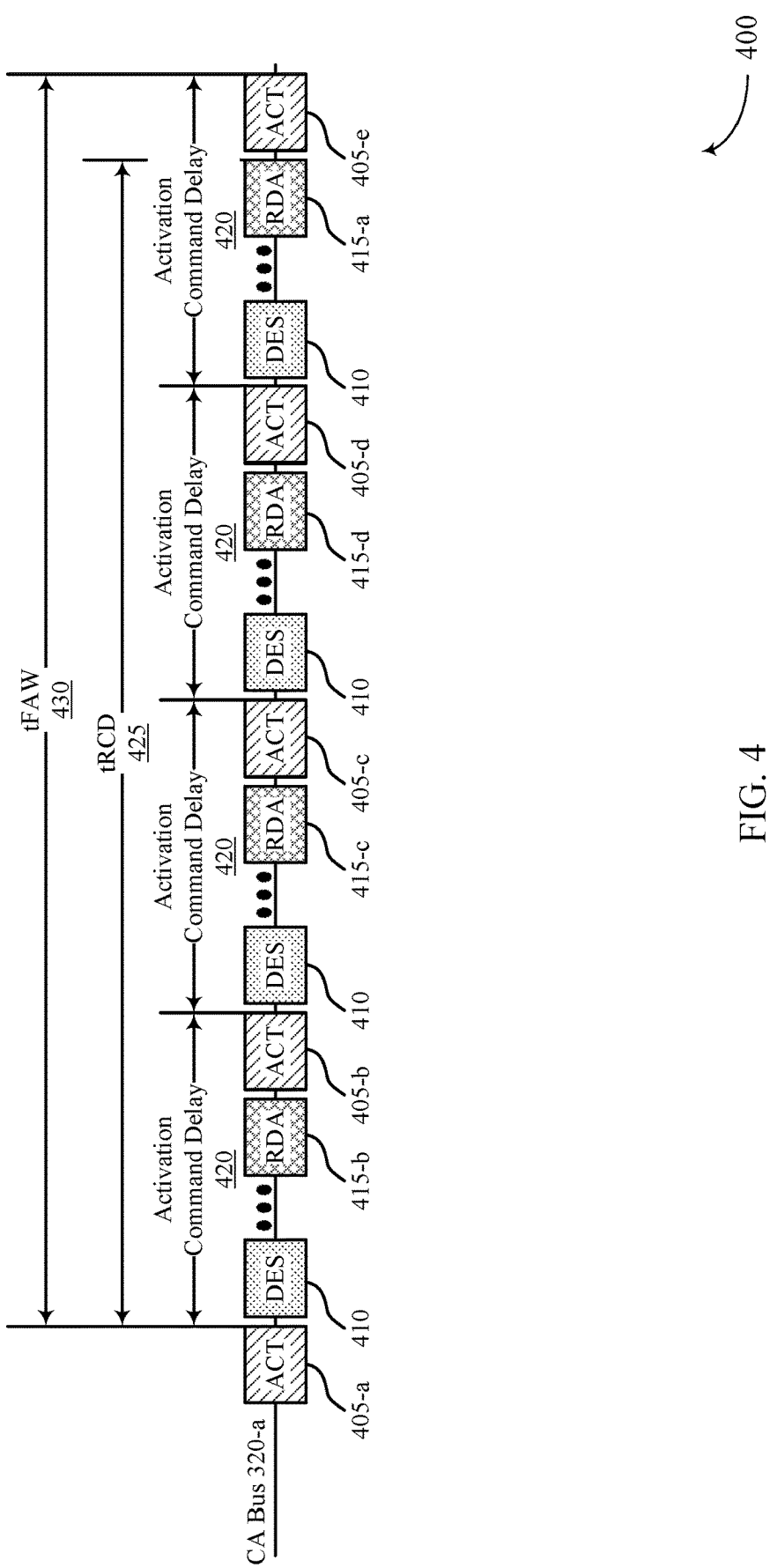
FIG. 4 illustrates an example of a command timeline that supports modification of a command timing pattern in accordance with examples as disclosed herein.

FIG. 4 illustrates an example of a command timeline 400 that supports modification of a command timing pattern in accordance with examples as disclosed herein. The command timeline 400 may include a CA bus 320-a, which may be an example of a CA bus 320 as described with reference to FIG. 3.

In accordance with examples as disclosed herein, a host device may transmit (e.g., issue) a quantity of deselect commands 410 (e.g., one or more DES commands) to a memory device between activation commands 405 (e.g., ACT commands) or data access commands (e.g., read commands 415, which may be referred to as RDA commands in some examples) to satisfy configured timing constraints, such as an activation command delay 420 (e.g., tRRD, tCCD, tRRD_S, or tCCD_S), tRCD 425, or tFAW 430. For example, the host device may transmit an activation command 405-a via the CA bus 320-a to activate a first set of memory cells in a first bank of a memory device. After transmitting the activation command 405-a, the host device may transmit a quantity of deselect commands 410 via the CA bus 320-a to satisfy the configured timing constraints. The host device may subsequently transmit an activation command 405-b to activate a second set of memory cells in a second bank of the memory device. For example, if the first bank is in a different bank group than the second bank, the quantity of deselect commands 410 may be based on a shortened activation command delay 420 (e.g., tRRD_S or tCCD_S). Additionally or alternatively, the quantity of deselect commands 410 may be based on tRCD 425 or tFAW 430. For example, the host device may transmit the quantity of deselect commands 410 to satisfy tRCD 425 between the activation command 405-*a* and a corresponding read command 415-*a* (e.g., a command to read data from the first set of memory cells). In some examples, the host device may additionally transmit an activation command 405-*c* and an activation command 405-*d*, where the quantity of deselect commands 410 may be based on tFAW 425, such that an activation command 405-*e* is transmitted outside the activation command window.

In some examples, each deselect command 410 may indicate a polarity (e.g., a high voltage or a low voltage) for a CA pin (e.g., a pin coupled with the CA bus 320-*a*) at the memory device. In some examples, the quantity of deselect commands 410 may include one or more sequences of deselect commands 410 (e.g., low-high-high-high). The host device may truncate a sequence of deselect commands 410 in the quantity of deselect commands 410, for example to satisfy the timing constraints without transmitting additional unnecessary commands. By dynamically configuring the quantity of deselect commands 410, the host device may improve latency and overall efficiency of system operations without violating the configured timing constraints.

Figure 5:
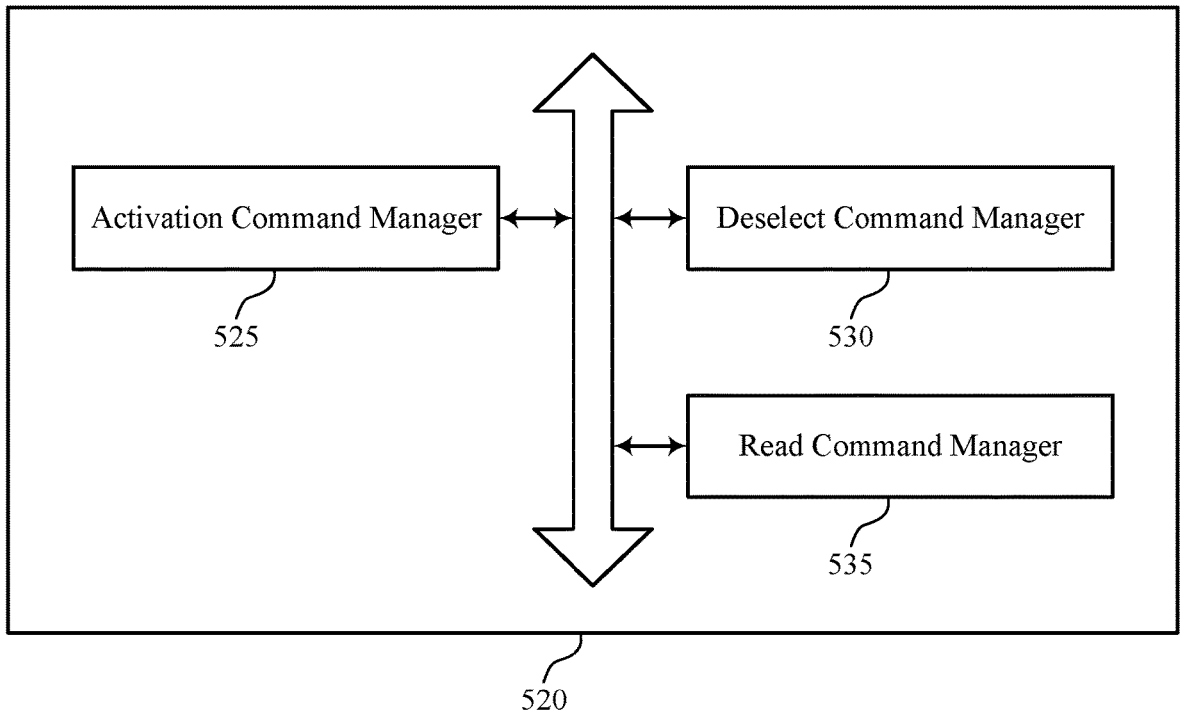
FIG. 5 shows a block diagram of a memory device that supports modification of a command timing pattern in accordance with examples as disclosed herein.

FIG. 5 shows a block diagram 500 of a memory device 520 that supports modification of a command timing pattern in accordance with examples as disclosed herein. The memory device 520 may be an example of aspects of a memory device as described with reference to FIGS. 1 through 4. The memory device 520, or various components thereof, may be an example of means for performing various aspects of modification of a command timing pattern as described herein. For example, the memory device 520 may include an activation command manager 525, a deselect command manager 530, a read command manager 535, or any combination thereof. Each of these components may communicate, directly or indirectly, with one another (e.g., via one or more buses).

The activation command manager 525 may be configured as or otherwise support a means for receiving a first activation command to activate a first set of memory cells in a first bank of a memory device. The deselect command manager 530 may be configured as or otherwise support a means for receiving, based at least in part on the first activation command, a quantity of deselect commands, the quantity of deselect commands based at least in part on one or both of a row activation command delay or a column activation command delay, and based at least in part on one or both of a row address to column address delay or an activation command window. In some examples, the activation command manager 525 may be configured as or otherwise support a means for receiving, based at least in part on the deselect commands, a second activation command to activate a second set of memory cells in a second bank of the memory device.

In some examples, the read command manager 535 may be configured as or otherwise support a means for receiving, after receiving the first activation command and after a duration that is based at least in part on the row address to column address delay, a read command associated with the first bank of the memory device.

In some examples, the second activation command is received within the activation command window, and the activation command manager 525 may be configured as or otherwise support a means for receiving, within the activation command window, a third activation command to activate a third set of memory cells in a third bank of the memory device. In some examples, the second activation command is received within the activation command window, and the activation command manager 525 may be configured as or otherwise support a means for receiving, within the activation command window, a fourth activation command to activate a fourth set of memory cells in a fourth bank of the memory device. In some examples, the second activation command is received within the activation command window, and the activation command manager 525 may be configured as or otherwise support a means for receiving, after receiving the first activation command and after the activation command window, a fifth activation command to activate a fifth set of memory cells in a fifth bank of the memory device.

In some examples, the deselect commands include a sequence of deselect commands.

In some examples, the sequence of deselect commands includes a first deselect command indicating a first polarity for a command/address pin and a second deselect command indicating a second polarity for the command/address pin.

In some examples, the sequence of deselect commands is truncated based at least in part on one or both of the row activation command delay or the column activation command delay. In some examples, the sequence of deselect commands is truncated based at least in part on one or both of the row address to column address delay or the activation command window.

In some examples, the second bank is in a different bank group than the first bank. In some examples, the row activation command delay includes a shortened row activation command delay based at least in part on the second bank being in a different bank group than the first bank. In some examples, the column activation command delay includes a shortened column activation command delay based at least in part on the second bank being in a different bank group than the first bank.

Figure 6:
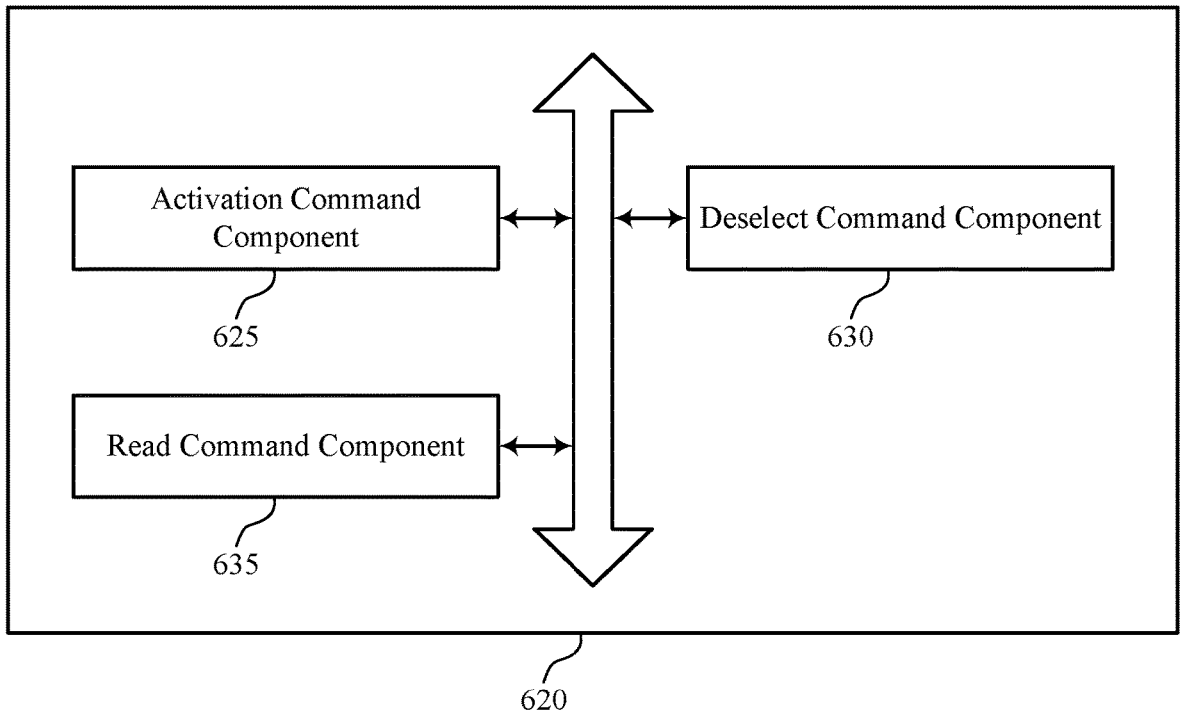
FIG. 6 shows a block diagram of a host device that supports modification of a command timing pattern in accordance with examples as disclosed herein.

FIG. 6 shows a block diagram 600 of a host device 620 that supports modification of a command timing pattern in accordance with examples as disclosed herein. The host device 620 may be an example of aspects of a host device as described with reference to FIGS. 1 through 4. The host device 620, or various components thereof, may be an example of means for performing various aspects of modification of a command timing pattern as described herein. For example, the host device 620 may include an activation command component 625, a deselect command component 630, a read command component 635, or any combination thereof. Each of these components may communicate, directly or indirectly, with one another (e.g., via one or more buses).

The activation command component 625 may be configured as or otherwise support a means for transmitting a first activation command to activate a first set of memory cells in a first bank of a memory device. The deselect command component 630 may be configured as or otherwise support a means for transmitting, based at least in part on the first activation command, a quantity of deselect commands, the quantity of deselect commands based at least in part on one or both of a row activation command delay or a column activation command delay, and based at least in part on one or both of a row address to column address delay or an activation command window. In some examples, the activation command component 625 may be configured as or otherwise support a means for transmitting, based at least in part on the deselect commands, a second activation command to activate a second set of memory cells in a second bank of the memory device.

In some examples, the read command component 635 may be configured as or otherwise support a means for transmitting, after transmitting the first activation command and after a duration that is based at least in part on the row address to column address delay, a read command associated with the first bank of the memory device.

In some examples, the second activation command is transmitted within the activation command window, and the activation command component 625 may be configured as or otherwise support a means for transmitting, within the activation command window, a third activation command to activate a third set of memory cells in a third bank of the memory device. In some examples, the second activation command is transmitted within the activation command window, and the activation command component 625 may be configured as or otherwise support a means for transmitting, within the activation command window, a fourth activation command to activate a fourth set of memory cells in a fourth bank of the memory device. In some examples, the second activation command is transmitted within the activation command window, and the activation command component 625 may be configured as or otherwise support a means for transmitting, after transmitting the first activation command and after the activation command window, a fifth activation command to activate a fifth set of memory cells in a fifth bank of the memory device.

In some examples, the deselect commands include a sequence of deselect commands.

In some examples, the sequence of deselect commands includes a first deselect command indicating a first polarity for a command/address pin of the memory device and a second deselect command indicating a second polarity for the command/address pin of the memory device.

In some examples, the deselect command component 630 may be configured as or otherwise support a means for truncating the sequence of deselect commands based at least in part on one or both of the row activation command delay or the column activation command delay, and based at least in part on one or both of the row address to column address delay or the activation command window.

In some examples, the second bank is in a different bank group than the first bank. In some examples, the row activation command delay includes a shortened row activation command delay based at least in part on the second bank being in a different bank group than the first bank. In some examples, the column activation command delay includes a shortened column activation command delay based at least in part on the second bank being in a different bank group than the first bank.

Figure 7:
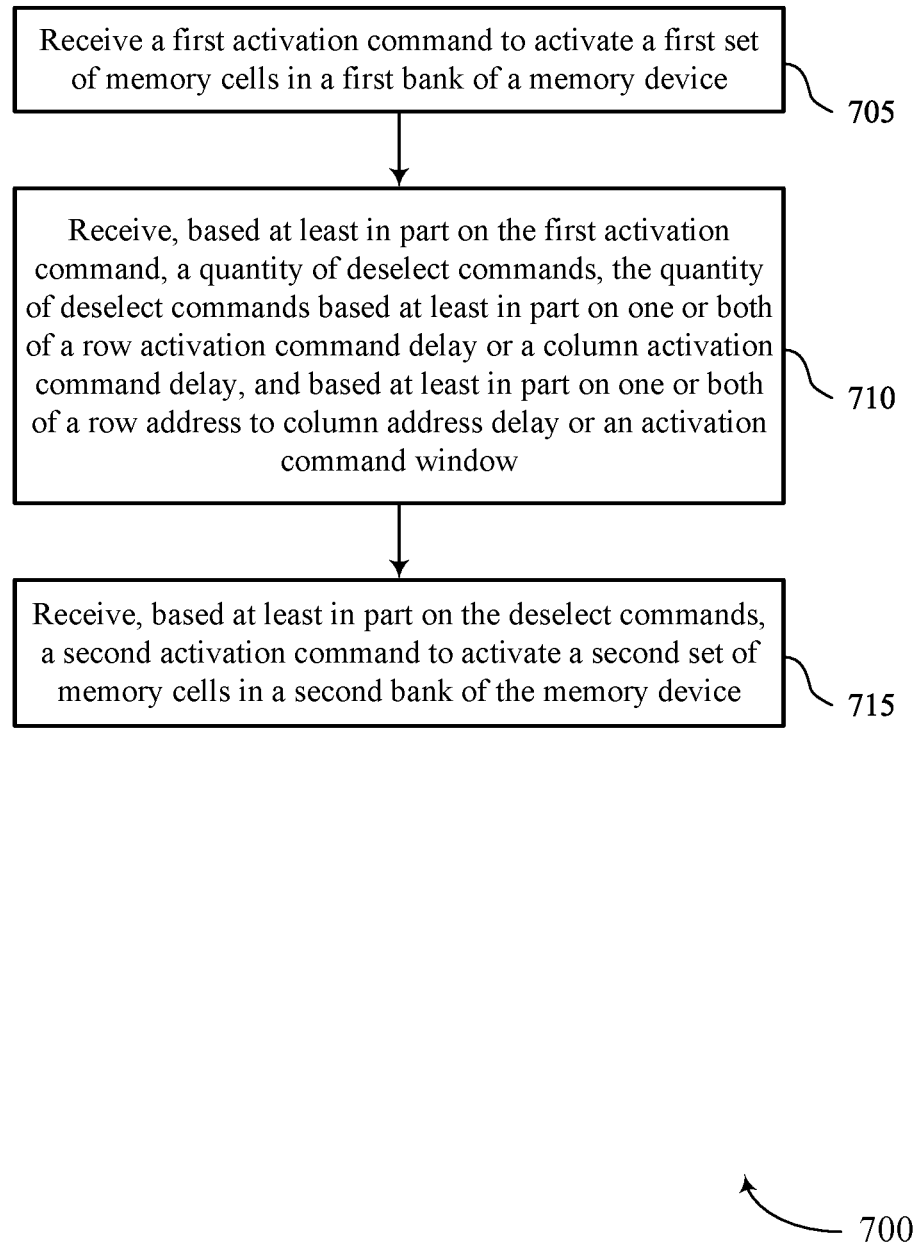
FIGS. 7 and 8 show flowcharts illustrating a method or methods that support modification of a command timing pattern in accordance with examples as disclosed herein.

FIG. 7 shows a flowchart illustrating a method 700 that supports modification of a command timing pattern in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 705, the method may include receiving a first activation command to activate a first set of memory cells in a first bank of a memory device. The operations of 705 may be performed in accordance with examples as disclosed herein. In some examples, aspects of the operations of 705 may be performed by an activation command manager 525 as described with reference to FIG. 5.

At 710, the method may include receiving, based at least in part on the first activation command, a quantity of deselect commands, the quantity of deselect commands based at least in part on one or both of a row activation command delay or a column activation command delay, and based at least in part on one or both of a row address to column address delay or an activation command window. The operations of 710 may be performed in accordance with examples as disclosed herein. In some examples, aspects of the operations of 710 may be performed by a deselect command manager 530 as described with reference to FIG. 5.

At 715, the method may include receiving, based at least in part on the deselect commands, a second activation command to activate a second set of memory cells in a second bank of the memory device. The operations of 715 may be performed in accordance with examples as disclosed herein. In some examples, aspects of the operations of 715 may be performed by an activation command manager 525 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a first activation command to activate a first set of memory cells in a first bank of a memory device; receiving, based at least in part on the first activation command, a quantity of deselect commands, the quantity of deselect commands based at least in part on one or both of a row activation command delay or a column activation command delay, and based at least in part on one or both of a row address to column address delay or an activation command window; and receiving, based at least in part on the deselect commands, a second activation command to activate a second set of memory cells in a second bank of the memory device.

Aspect 2: The method, apparatus, or non-transitory computer-readable medium of aspect 1, further including operations, features, circuitry, logic, means, or instructions, or any combination thereof for receiving, after receiving the first activation command and after a duration that is based at least in part on the row address to column address delay, a read command associated with the first bank of the memory device.

Aspect 3: The method, apparatus, or non-transitory computer-readable medium of any of aspects 1 through 2 where the second activation command is received within the activation command window and the method, apparatuses, and non-transitory computer-readable medium, further includes operations, features, circuitry, logic, means, or instructions, or any combination thereof for receiving, within the activation command window, a third activation command to activate a third set of memory cells in a third bank of the memory device; receiving, within the activation command window, a fourth activation command to activate a fourth set of memory cells in a fourth bank of the memory device; and receiving, after receiving the first activation command and after the activation command window, a fifth activation command to activate a fifth set of memory cells in a fifth bank of the memory device.

Aspect 4: The method, apparatus, or non-transitory computer-readable medium of any of aspects 1 through 3 where the deselect commands include a sequence of deselect commands.

Aspect 5: The method, apparatus, or non-transitory computer-readable medium of aspect 4 where the sequence of deselect commands includes a first deselect command indicating a first polarity for a command/address pin and a second deselect command indicating a second polarity for the command/address pin.

Aspect 6: The method, apparatus, or non-transitory computer-readable medium of any of aspects 4 through 5 where the sequence of deselect commands is truncated based at least in part on one or both of the row activation command delay or the column activation command delay and the sequence of deselect commands is truncated based at least in part on one or both of the row address to column address delay or the activation command window.

Aspect 7: The method, apparatus, or non-transitory computer-readable medium of any of aspects 1 through 6 where the second bank is in a different bank group than the first bank; the row activation command delay includes a shortened row activation command delay based at least in part on the second bank being in a different bank group than the first bank; and the column activation command delay includes a shortened column activation command delay based at least in part on the second bank being in a different bank group than the first bank.

Figure 8:
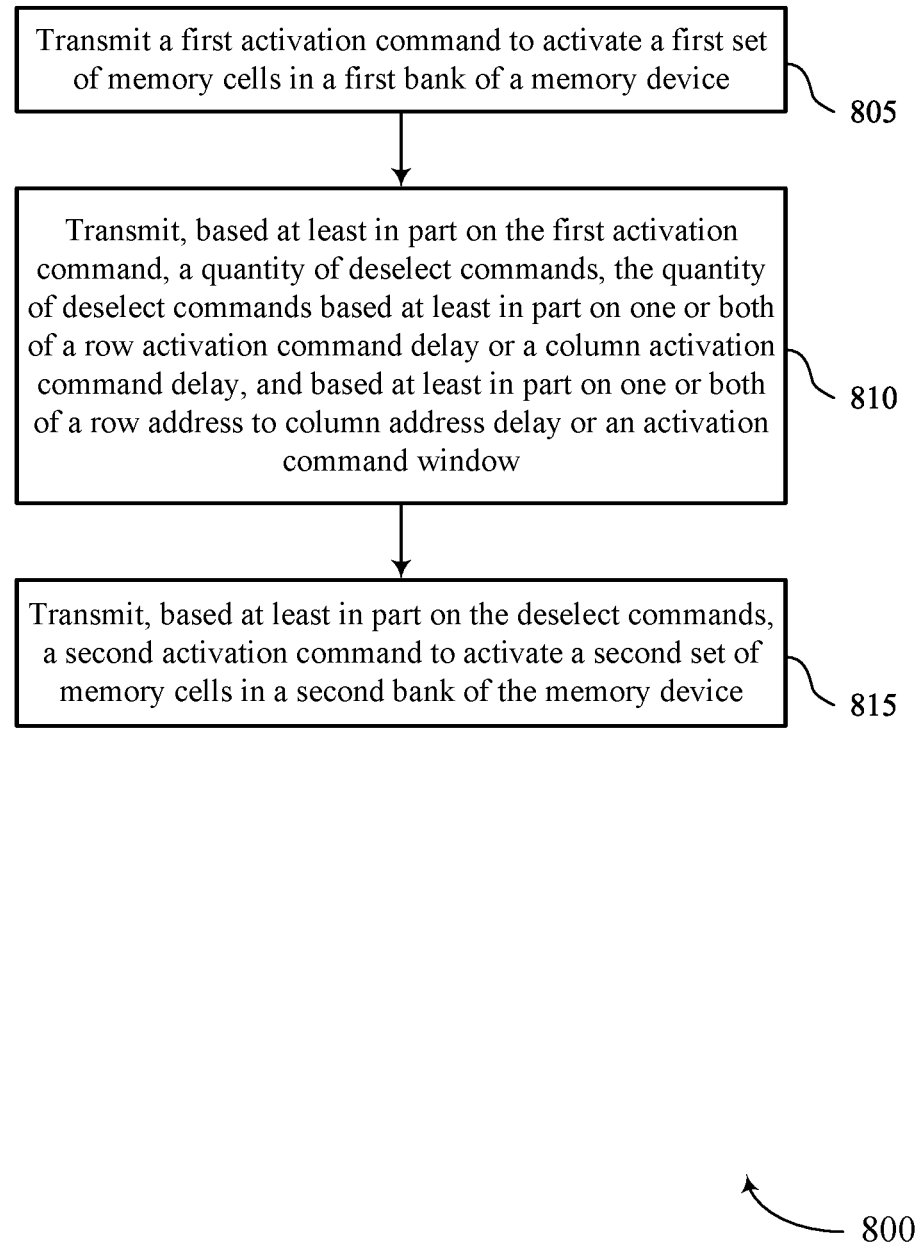

FIG. 8 shows a flowchart illustrating a method 800 that supports modification of a command timing pattern in accordance with examples as disclosed herein. The operations of method 800 may be implemented by a host device or its components as described herein. For example, the operations of method 800 may be performed by a host device as described with reference to FIGS. 1 through 4 and 6. In some examples, a host device may execute a set of instructions to control the functional elements of the device to perform the described functions. Additionally or alternatively, the host device may perform aspects of the described functions using special-purpose hardware.

At 805, the method may include transmitting a first activation command to activate a first set of memory cells in a first bank of a memory device. The operations of 805 may be performed in accordance with examples as disclosed herein. In some examples, aspects of the operations of 805 may be performed by an activation command component 625 as described with reference to FIG. 6.

At 810, the method may include transmitting, based at least in part on the first activation command, a quantity of deselect commands, the quantity of deselect commands based at least in part on one or both of a row activation command delay or a column activation command delay, and based at least in part on one or both of a row address to column address delay or an activation command window. The operations of 810 may be performed in accordance with examples as disclosed herein. In some examples, aspects of the operations of 810 may be performed by a deselect command component 630 as described with reference to FIG. 6.

At 815, the method may include transmitting, based at least in part on the deselect commands, a second activation command to activate a second set of memory cells in a second bank of the memory device. The operations of 815 may be performed in accordance with examples as disclosed herein. In some examples, aspects of the operations of 815 may be performed by an activation command component 625 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 8: A method, apparatus, or non-transitory computer-readable medium including operations, features, circuitry, logic, means, or instructions, or any combination thereof for transmitting a first activation command to activate a first set of memory cells in a first bank of a memory device; transmitting, based at least in part on the first activation command, a quantity of deselect commands, the quantity of deselect commands based at least in part on one or both of a row activation command delay or a column activation command delay, and based at least in part on one or both of a row address to column address delay or an activation command window; and transmitting, based at least in part on the deselect commands, a second activation command to activate a second set of memory cells in a second bank of the memory device.

Aspect 9: The method, apparatus, or non-transitory computer-readable medium of aspect 8, further including operations, features, circuitry, logic, means, or instructions, or any combination thereof for transmitting, after transmitting the first activation command and after a duration that is based at least in part on the row address to column address delay, a read command associated with the first bank of the memory device.

Aspect 10: The method, apparatus, or non-transitory computer-readable medium of any of aspects 8 through 9 where the second activation command is transmitted within the activation command window and the method, apparatuses, and non-transitory computer-readable medium, further includes operations, features, circuitry, logic, means, or instructions, or any combination thereof for transmitting, within the activation command window, a third activation command to activate a third set of memory cells in a third bank of the memory device; transmitting, within the activation command window, a fourth activation command to activate a fourth set of memory cells in a fourth bank of the memory device; and transmitting, after transmitting the first activation command and after the activation command window, a fifth activation command to activate a fifth set of memory cells in a fifth bank of the memory device.

Aspect 11: The method, apparatus, or non-transitory computer-readable medium of any of aspects 8 through 10 where the deselect commands include a sequence of deselect commands.

Aspect 12: The method, apparatus, or non-transitory computer-readable medium of aspect 11 where the sequence of deselect commands includes a first deselect command indicating a first polarity for a command/address pin of the memory device and a second deselect command indicating a second polarity for the command/address pin of the memory device.

Aspect 13: The method, apparatus, or non-transitory computer-readable medium of any of aspects 11 through 12, further including operations, features, circuitry, logic, means, or instructions, or any combination thereof for truncating the sequence of deselect commands based at least in part on one or both of the row activation command delay or the column activation command delay, and based at least in part on one or both of the row address to column address delay or the activation command window.

Aspect 14: The method, apparatus, or non-transitory computer-readable medium of any of aspects 8 through 13 where the second bank is in a different bank group than the first bank; the row activation command delay includes a shortened row activation command delay based at least in part on the second bank being in a different bank group than the first bank; and the column activation command delay includes a shortened column activation command delay based at least in part on the second bank being in a different bank group than the first bank.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 15: An apparatus, including: a controller coupled with a memory device and configured to cause the apparatus to: receive a first activation command to activate a first set of memory cells in a first bank of the memory device; receive, based at least in part on the first activation command, a quantity of deselect commands, the quantity of deselect commands based at least in part on one or both of a row activation command delay or a column activation command delay, and based at least in part on one or both of a row address to column address delay or an activation command window; and receive, based at least in part on the deselect commands, a second activation command to activate a second set of memory cells in a second bank of the memory device.

Aspect 16: The apparatus of aspect 15, where the controller is further configured to cause the apparatus to: receive, after receiving the first activation command and after a duration that is based at least in part on the row address to column address delay, a read command associated with the first bank of the memory device.

Aspect 17: The apparatus of any of aspects 15 through 16, where the second activation command is received within the activation command window, and where the controller is further configured to cause the apparatus to: receive, within the activation command window, a third activation command to activate a third set of memory cells in a third bank of the memory device; receive, within the activation command window, a fourth activation command to activate a fourth set of memory cells in a fourth bank of the memory device; and receive, after receiving the first activation command and after the activation command window, a fifth activation command to activate a fifth set of memory cells in a fifth bank of the memory device.

Aspect 18: The apparatus of any of aspects 15 through 17, where the deselect commands include a sequence of deselect commands.

Aspect 19: The apparatus of aspect 18, where the sequence of deselect commands includes a first deselect command indicating a first polarity for a command/address pin and a second deselect command indicating a second polarity for the command/address pin.

Aspect 20: The apparatus of any of aspects 18 through 19, where the sequence of deselect commands is truncated based at least in part on one or both of the row activation command delay or the column activation command delay, and the sequence of deselect commands is truncated based at least in part on one or both of the row address to column address delay or the activation command window.

Aspect 21: The apparatus of any of aspects 15 through 20, where: the second bank is in a different bank group than the first bank; the row activation command delay includes a shortened row activation command delay based at least in part on the second bank being in a different bank group than the first bank; and the column activation command delay includes a shortened column activation command delay based at least in part on the second bank being in a different bank group than the first bank.

An apparatus is described. The following provides an overview of aspects of the apparatus as described herein:

Aspect 22: An apparatus, including: a controller coupled with a host device, where the controller is configured to cause the apparatus to: transmit a first activation command to activate a first set of memory cells in a first bank of a memory device; transmit, based at least in part on the first activation command, a quantity of deselect commands, the quantity of deselect commands based at least in part on one or both of a row activation command delay or a column activation command delay, and based at least in part on one or both of a row address to column address delay or an activation command window; and transmit, based at least in part on the deselect commands, a second activation command to activate a second set of memory cells in a second bank of the memory device.

Aspect 23: The apparatus of aspect 22, where the controller is further configured to cause the apparatus to: transmit, after transmitting the first activation command and after a duration that is based at least in part on the row address to column address delay, a read command associated with the first bank of the memory device.

Aspect 24: The apparatus of any of aspects 22 through 23, where the second activation command is transmitted within the activation command window, and the controller is further configured to cause the apparatus to: transmit, within the activation command window, a third activation command to activate a third set of memory cells in a third bank of the memory device; transmit, within the activation command window, a fourth activation command to activate a fourth set of memory cells in a fourth bank of the memory device; and transmit, after transmitting the first activation command and after the activation command window, a fifth activation command to activate a fifth set of memory cells in a fifth bank of the memory device.

Aspect 25: The apparatus of any of aspects 22 through 24, where the deselect commands include a sequence of deselect commands.

Aspect 26: The apparatus of aspect 25, where the sequence of deselect commands includes a first deselect command indicating a first polarity for a command/address pin of the memory device and a second deselect command indicating a second polarity for the command/address pin of the memory device.

Aspect 27: The apparatus of any of aspects 25 through 26, where the controller is further configured to cause the apparatus to: truncate the sequence of deselect commands based at least in part on one or both of the row activation command delay or the column activation command delay, and based at least in part on one or both of the row address to column address delay or the activation command window.

Aspect 28: The apparatus of any of aspects 22 through 27, where: the second bank is in a different bank group than the first bank; the row activation command delay includes a shortened row activation command delay based at least in part on the second bank being in a different bank group than the first bank; and the column activation command delay includes a shortened column activation command delay based at least in part on the second bank being in a different bank group than the first bank.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving a first activation command to activate a first set of memory cells in a first bank of a memory device;
   receiving, based at least in part on the first activation command, a quantity of deselect commands, the quantity of deselect commands based at least in part on one or both of a row activation command delay or a column activation command delay, and based at least in part on one or both of a row address to column address delay or an activation command window; and
   receiving, based at least in part on the deselect commands, a second activation command to activate a second set of memory cells in a second bank of the memory device.

2. The method of claim 1, further comprising:
   receiving, after receiving the first activation command and after a duration that is based at least in part on the row address to column address delay, a read command associated with the first bank of the memory device.

3. The method of claim 1, wherein the second activation command is received within the activation command window, the method further comprising:
   receiving, within the activation command window, a third activation command to activate a third set of memory cells in a third bank of the memory device;
   receiving, within the activation command window, a fourth activation command to activate a fourth set of memory cells in a fourth bank of the memory device; and
   receiving, after receiving the first activation command and after the activation command window, a fifth activation command to activate a fifth set of memory cells in a fifth bank of the memory device.

4. The method of claim 1, wherein the deselect commands comprise a sequence of deselect commands.

5. The method of claim 4, wherein the sequence of deselect commands comprises a first deselect command indicating a first polarity for a command/address pin and a second deselect command indicating a second polarity for the command/address pin.

6. The method of claim 4, wherein:
   the sequence of deselect commands is truncated based at least in part on one or both of the row activation command delay or the column activation command delay, and
   the sequence of deselect commands is truncated based at least in part on one or both of the row address to column address delay or the activation command window.

7. The method of claim 1, wherein:
   the second bank is in a different bank group than the first bank;
   the row activation command delay comprises a shortened row activation command delay based at least in part on the second bank being in a different bank group than the first bank; and
   the column activation command delay comprises a shortened column activation command delay based at least in part on the second bank being in a different bank group than the first bank.

8. A method, comprising:
   transmitting a first activation command to activate a first set of memory cells in a first bank of a memory device;
   transmitting, based at least in part on the first activation command, a quantity of deselect commands, the quantity of deselect commands based at least in part on one or both of a row activation command delay or a column activation command delay, and based at least in part on one or both of a row address to column address delay or an activation command window; and
   transmitting, based at least in part on the deselect commands, a second activation command to activate a second set of memory cells in a second bank of the memory device.

9. The method of claim 8, further comprising:
   transmitting, after transmitting the first activation command and after a duration that is based at least in part on the row address to column address delay, a read command associated with the first bank of the memory device.

10. The method of claim 8, wherein the second activation command is transmitted within the activation command window, the method further comprising:
transmitting, within the activation command window, a third activation command to activate a third set of memory cells in a third bank of the memory device;
transmitting, within the activation command window, a fourth activation command to activate a fourth set of memory cells in a fourth bank of the memory device; and
transmitting, after transmitting the first activation command and after the activation command window, a fifth activation command to activate a fifth set of memory cells in a fifth bank of the memory device.

11. The method of claim 8, wherein the deselect commands comprise a sequence of deselect commands.

12. The method of claim 11, wherein the sequence of deselect commands comprises a first deselect command indicating a first polarity for a command/address pin of the memory device and a second deselect command indicating a second polarity for the command/address pin of the memory device.

13. The method of claim 11, further comprising:
truncating the sequence of deselect commands based at least in part on one or both of the row activation command delay or the column activation command delay, and based at least in part on one or both of the row address to column address delay or the activation command window.

14. The method of claim 8, wherein:
the second bank is in a different bank group than the first bank;
the row activation command delay comprises a shortened row activation command delay based at least in part on the second bank being in a different bank group than the first bank; and
the column activation command delay comprises a shortened column activation command delay based at least in part on the second bank being in a different bank group than the first bank.

15. An apparatus, comprising:
a controller coupled with a memory device and configured to cause the apparatus to:
receive a first activation command to activate a first set of memory cells in a first bank of the memory device;
receive, based at least in part on the first activation command, a quantity of deselect commands, the quantity of deselect commands based at least in part on one or both of a row activation command delay or a column activation command delay, and based at least in part on one or both of a row address to column address delay or an activation command window; and
receive, based at least in part on the deselect commands, a second activation command to activate a second set of memory cells in a second bank of the memory device.

16. The apparatus of claim 15, wherein the controller is further configured to cause the apparatus to:
receive, after receiving the first activation command and after a duration that is based at least in part on the row address to column address delay, a read command associated with the first bank of the memory device.

17. The apparatus of claim 15, wherein the second activation command is received within the activation command window, and wherein the controller is further configured to cause the apparatus to:
receive, within the activation command window, a third activation command to activate a third set of memory cells in a third bank of the memory device;
receive, within the activation command window, a fourth activation command to activate a fourth set of memory cells in a fourth bank of the memory device; and
receive, after receiving the first activation command and after the activation command window, a fifth activation command to activate a fifth set of memory cells in a fifth bank of the memory device.

18. The apparatus of claim 15, wherein the deselect commands comprise a sequence of deselect commands.

19. The apparatus of claim 18, wherein the sequence of deselect commands comprises a first deselect command indicating a first polarity for a command/address pin and a second deselect command indicating a second polarity for the command/address pin.

20. The apparatus of claim 18, wherein:
the sequence of deselect commands is truncated based at least in part on one or both of the row activation command delay or the column activation command delay, and
the sequence of deselect commands is truncated based at least in part on one or both of the row address to column address delay or the activation command window.

21. The apparatus of claim 15, wherein:
the second bank is in a different bank group than the first bank;
the row activation command delay comprises a shortened row activation command delay based at least in part on the second bank being in a different bank group than the first bank; and
the column activation command delay comprises a shortened column activation command delay based at least in part on the second bank being in a different bank group than the first bank.

22. An apparatus, comprising:
a controller coupled with a host device, wherein the controller is configured to cause the apparatus to:
transmit a first activation command to activate a first set of memory cells in a first bank of a memory device;
transmit, based at least in part on the first activation command, a quantity of deselect commands, the quantity of deselect commands based at least in part on one or both of a row activation command delay or a column activation command delay, and based at least in part on one or both of a row address to column address delay or an activation command window; and
transmit, based at least in part on the deselect commands, a second activation command to activate a second set of memory cells in a second bank of the memory device.

23. The apparatus of claim 22, wherein the controller is further configured to cause the apparatus to:
transmit, after transmitting the first activation command and after a duration that is based at least in part on the row address to column address delay, a read command associated with the first bank of the memory device.

24. The apparatus of claim 22, wherein the second activation command is transmitted within the activation command window, and the controller is further configured to cause the apparatus to:

transmit, within the activation command window, a third activation command to activate a third set of memory cells in a third bank of the memory device;

transmit, within the activation command window, a fourth activation command to activate a fourth set of memory cells in a fourth bank of the memory device; and transmit, after transmitting the first activation command and after the activation command window, a fifth activation command to activate a fifth set of memory cells in a fifth bank of the memory device.

25. The apparatus of claim 22, wherein the deselect commands comprise a sequence of deselect commands.

26. The apparatus of claim 25, wherein the sequence of deselect commands comprises a first deselect command indicating a first polarity for a command/address pin of the memory device and a second deselect command indicating a second polarity for the command/address pin of the memory device.

27. The apparatus of claim 25, wherein the controller is further configured to cause the apparatus to:

truncate the sequence of deselect commands based at least in part on one or both of the row activation command delay or the column activation command delay, and based at least in part on one or both of the row address to column address delay or the activation command window.

28. The apparatus of claim 22, wherein:

the second bank is in a different bank group than the first bank;

the row activation command delay comprises a shortened row activation command delay based at least in part on the second bank being in a different bank group than the first bank; and the column activation command delay comprises a shortened column activation command delay based at least in part on the second bank being in a different bank group than the first bank.

29. A non-transitory computer-readable medium storing code, the code comprising instructions executable by a processor to:

receive a first activation command to activate a first set of memory cells in a first bank of a memory device;

receive, based at least in part on the first activation command, a quantity of deselect commands, the quantity of deselect commands based at least in part on one or both of a row activation command delay or a column activation command delay, and based at least in part on one or both of a row address to column address delay or an activation command window; and receive, based at least in part on the deselect commands, a second activation command to activate a second set of memory cells in a second bank of the memory device.

30. The non-transitory computer-readable medium of claim 29, wherein the instructions are further executable by the processor to:

receive, after receiving the first activation command and after a duration that is based at least in part on the row address to column address delay, a read command associated with the first bank of the memory device.

31. The non-transitory computer-readable medium of claim 29, wherein the second activation command is received within the activation command window, and wherein the instructions are further executable by the processor to:

receive, within the activation command window, a third activation command to activate a third set of memory cells in a third bank of the memory device;

receive, within the activation command window, a fourth activation command to activate a fourth set of memory cells in a fourth bank of the memory device; and receive, after receiving the first activation command and after the activation command window, a fifth activation command to activate a fifth set of memory cells in a fifth bank of the memory device.

32. The non-transitory computer-readable medium of claim 29, wherein the deselect commands comprise a sequence of deselect commands.

33. The non-transitory computer-readable medium of claim 32, wherein the sequence of deselect commands comprises a first deselect command indicating a first polarity for a command/address pin and a second deselect command indicating a second polarity for the command/address pin.

34. The non-transitory computer-readable medium of claim 32, wherein:

the sequence of deselect commands is truncated based at least in part on one or both of the row activation command delay or the column activation command delay, and the sequence of deselect commands is truncated based at least in part on one or both of the row address to column address delay or the activation command window.

35. The non-transitory computer-readable medium of claim 29, wherein:

the second bank is in a different bank group than the first bank;

the row activation command delay comprises a shortened row activation command delay based at least in part on the second bank being in a different bank group than the first bank; and the column activation command delay comprises a shortened column activation command delay based at least in part on the second bank being in a different bank group than the first bank.

* * * * *